United States Patent
Pearce et al.

(10) Patent No.: US 8,802,479 B2
(45) Date of Patent: Aug. 12, 2014

(54) SOLAR CELL INTERCONNECTION METHOD USING A FLAT METALLIC MESH

(75) Inventors: David B. Pearce, Saratoga, CA (US); Bruce D. Hachtmann, San Martin, CA (US); Liguang Gong, Union City, CA (US); Thomas M. Valeri, Gilroy, CA (US); Dennis R. Hollars, San Jose, CA (US)

(73) Assignee: NuvoSun, Inc., Milpitas, CA (US)

( * ) Notice: Subject to any disclaimer, the term of this patent is extended or adjusted under 35 U.S.C. 154(b) by 353 days.

(21) Appl. No.: 12/793,617

(22) Filed: Jun. 3, 2010

(65) Prior Publication Data

US 2011/0300661 A1    Dec. 8, 2011

(51) Int. Cl.
*H01L 31/18* (2006.01)
*H01B 5/00* (2006.01)

(52) U.S. Cl.
USPC .............................................. 438/66; 438/68

(58) Field of Classification Search
CPC ........... H01L 31/05; H01L 31/18; H01B 5/00
USPC ................. 438/57, 61, 66–68, 98; 174/126.1, 174/126.2; 136/244, 252, 256; 257/E31.127, 81, 82, 99, 431, 461; 427/58, 123

See application file for complete search history.

(56) References Cited

U.S. PATENT DOCUMENTS

| | | | |
|---|---|---|---|
| 3,375,141 A | 3/1968 | Julius | |
| 4,260,429 A | 4/1981 | Moyer | |
| 4,283,591 A | 8/1981 | Boer | |
| 4,328,293 A * | 5/1982 | Lisse | 429/149 |
| 4,450,033 A | 5/1984 | Little | |
| 4,652,693 A | 3/1987 | Bar-on | |
| 4,685,608 A | 8/1987 | Kujas | |
| 5,100,808 A | 3/1992 | Glenn | |
| 5,474,622 A | 12/1995 | Negami et al. | |
| 6,313,396 B1 | 11/2001 | Glenn | |
| 6,414,235 B1 | 7/2002 | Luch | |
| 6,472,594 B1 | 10/2002 | Ichinose et al. | |
| 6,531,653 B1 | 3/2003 | Glenn et al. | |

(Continued)

FOREIGN PATENT DOCUMENTS

JP    S62016579    1/1987

OTHER PUBLICATIONS

International search report and written opinion dated Jan. 12, 2012 for PCT/US11/038887.
Supplemental EP Search Report, mailed Mar. 24, 2014.

*Primary Examiner* — Walter H Swanson
(74) *Attorney, Agent, or Firm* — McDonnell Boehnen Hulbert & Berghoff LLP (57) ABSTRACT

An improved method for interconnecting thin film solar cells to form solar cell modules is provided, the method comprising using a flat metallic mesh formed from a thin metallic strip to provide a current collection grid over a thin film solar cell. The method is particularly useful for forming interconnections between thin film solar cells deposited on flexible substrates. The rectangular cross sectional shape of the mesh elements provides an increased area of electrical contact to the solar cell compared to the small tangential area provided by elements of circular cross section. Mesh elements can be made higher rather than wider to improve conductivity without proportionally increasing shading loss. Various coatings can be applied to the mesh to improve its performance, provide corrosion resistance, and improve its cosmetic appearance.

23 Claims, 9 Drawing Sheets

(56) References Cited

U.S. PATENT DOCUMENTS

| | | |
|---|---|---|
| 6,936,761 B2 | 8/2005 | Pichler |
| 7,829,781 B2 | 11/2010 | Montello et al. |
| 2001/0004901 A1 | 6/2001 | Yamanaka et al. |
| 2001/0050102 A1 | 12/2001 | Matsumi et al. |
| 2003/0230337 A1 | 12/2003 | Gaudiana et al. |
| 2005/0005964 A1 | 1/2005 | Komatsu |
| 2005/0263180 A1 | 12/2005 | Montello et al. |
| 2007/0065962 A1* | 3/2007 | Pichler .......................... 438/47 |
| 2008/0227236 A1* | 9/2008 | Luch .............................. 438/73 |
| 2009/0014057 A1* | 1/2009 | Croft et al. .................... 136/248 |
| 2009/0111206 A1 | 4/2009 | Luch |
| 2009/0308430 A1 | 12/2009 | Everett et al. |
| 2010/0043863 A1 | 2/2010 | Wudu et al. |
| 2010/0108141 A1 | 5/2010 | Fukushima et al. |
| 2010/0116310 A1 | 5/2010 | Shimizu et al. |

\* cited by examiner

SOLAR CELL INTERCONNECTION METHOD USING A FLAT METALLIC MESH

FIELD OF THE INVENTION

This invention generally relates to the electrical interconnection of solar cells to form a solar module, and, more specifically, to thin film solar cells formed on flexible or rigid substrates.

BACKGROUND OF THE INVENTION

Current thin film solar cells on flexible substrates are limited to amorphous silicon on a thin metal foil (usually stainless steel) and copper indium gallium diselenide (CIGS) on metallic or polyimide foils. Currently, thin film cadmium telluride (CdTe) solar cells are produced only on glass, but work is being done on a flexible substrate embodiment. To be useful in a solar power system, all types of solar cells must be electrically interconnected serially with other similar solar cells to raise the voltage levels and minimize $I^2R$ losses that would otherwise occur due to high currents. Cells deposited on large rigid sheets of glass generally use a system of scribes applied between different process steps and at specific locations to interconnect the cells over the entire sheet. This procedure is called "monolithic integration". Such a method is difficult to implement on flexible substrates because of the accuracy required for both the placement and depth of the scribes. Additionally, flexible substrates enable roll-to-roll processing which can become less desirable economically if the process is interrupted to implement the scribing operations, even if they could be readily accomplished. It is less common for thin film solar cells to be deposited on rigid glass or metallic wafers similar to silicon wafers.

Conventional crystalline or polycrystalline silicon solar cells are formed on individual wafers, which then must be interconnected. Current collecting grids and buss bars are usually formed by screen-printing a pattern with silver bearing inks that are subsequently cured at high temperatures (on the order of about 700° C.). Silicon cells have an antireflection coating made from silicon nitride, which is transparent but non-conducting. During the curing stage the silver penetrates the silicon nitride coating and forms an ohmic contact to the silicon cell. The usual grid pattern consists of a series of fine straight and parallel lines spaced a few millimeters apart with two or three wider lines (buss bars) running perpendicular to the pattern of fine lines. The resulting structure provides a surface on the buss bars to which interconnecting "Z" tabs can be attached by conventional soldering or bonding methods. The cell current is collected by the relatively narrow grids and transmitted to the relatively wider buss bars, which then become the connection points to the next cell. The "Z" tab structure provides a flexible interconnection between cells that helps reduce damage due to thermal expansion and contraction during use. An advantage of this method over monolithic integration is that the cells can be tested and sorted for performance prior to module build. In this way the module performance is not limited by the lowest performing cell in the string.

The screen-printing method applied to thin film flexible solar cells has met with only limited success. There are at least two problems associated with this method. First, the thin film cells cannot survive the high temperatures needed to adequately cure the silver inks. As a result of lower curing temperatures, some of the ink carriers and solvents remain in the grid line structure causing the metallic particles not to be well fused together. Both of these effects lower the conductivity of the grid lines and buss bars, and limit the solderability to the printed buss bars. Alternatively, the interconnection may be made with conductive epoxies, but it is generally inferior to soldering. Second, since the surface finish of useful flexible substrates is normally much rougher than that of glass or silicon wafers, many more defects exist which can become shunt sites if conductive ink is allowed to flow into them. This problem can be somewhat mitigated by first printing a much less conductive material, like a carbon ink to initially fill any defects, and then over printing with the silver ink. Consistently good results are difficult to achieve, since anything short of perfect printing registration causes extra shading loss as well as increased potential shunting. In addition, the cost of the materials and equipment is relatively high.

U.S. Pat. No. 5,474,621, which is entirely incorporated herein by reference, proposes using metallic wires as grids, but with the wires coated with carbon fibers of sufficient length to avoid or lessen the chance of being forced into defects. In this method, the wires are attached to the top electrode (transparent conductive oxide, or TCO) of the thin film amorphous silicon solar cells during the process of laminating them into modules. In effect, the prior art approach of first printing a carbon-based ink pattern is replaced with carbon fibers that have much less chance of causing shunts in film/substrate defects, and at the same time provide a fusing type of protection against sustained heavy shunt currents. The wire size and spacing must be selected so as to carry the current generated by the cell without generating significant resistive losses.

U.S. Pat. Nos. 4,260,429 and 4,283,591, which are entirely incorporated herein by reference, teach methods for coating conductive wires with a polymer that contains conducting particles. A limitation of these methods is that problems with defect-induced shunts can still exist because of smaller conductive particles in the distribution. Improvements to these methods were taught in U.S. Pat. No. 6,472,594, which is entirely incorporated herein by reference.

Figure 1A:
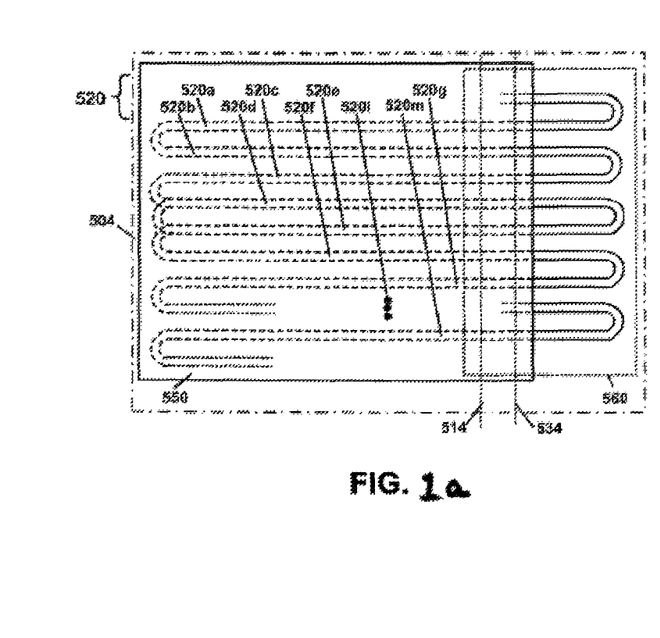
FIG. 1a schematically illustrates a prior art application of a wire to a carrier sheet to form a current collection grid for a thin film solar cell deposited on a flexible substrate.
Figure 1B:
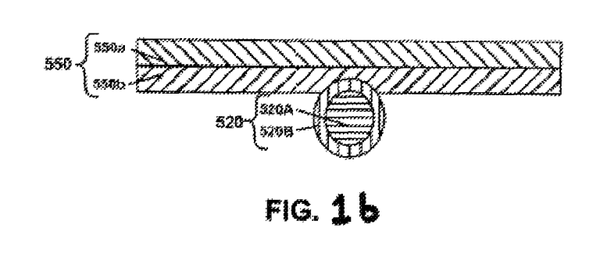
FIG. 1b is a detailed cross-sectional diagram showing a prior art embodiment of a wire attached to a carrier sheet.
Figure 1C:
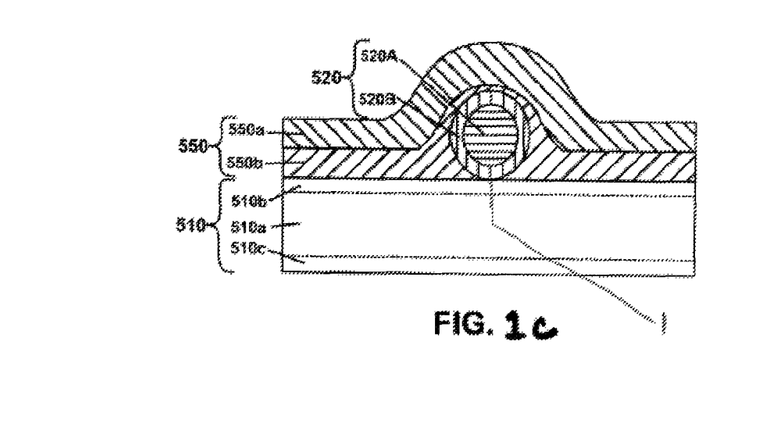
FIG. 1c is a detailed cross-sectional diagram showing a prior art embodiment of a wire and carrier sheet laminated to a flexible thin film solar cell.

More recently, U.S. Patent Application Publication No. 2010/0043863 to Wudu et al. ("Wudu"), which is entirely incorporated herein by reference, teaches a solution where a trace (or wire) pattern is formed first on a transparent carrier and then applied to the solar cell. Various teachings of Wudu are shown in FIGS. 1a, 1b and 1c. In FIG. 1a, a wire 520a is applied to a carrier 550 in a serpentine pattern. The loops in the wire at the ends of the pattern remain just on the carrier on one edge, but extend substantially past the carrier on the opposite edge. When applied to the cell, the carrier covers the active region of the cell while the extended loops provide an area to make electrical contact to the next cell. A detailed cross-sectional view of the carrier and the wire of Wudu are shown in FIG. 1b. Carrier 550 consists of two materials, a transparent polymer sheet 550a (for example, a thin PET sheet) and a thermal setting adhesive 550b. Wire 520 is partially embedded in the adhesive and consists of a normal wire 520A (for example, copper) that is coated with a protective and lower conductivity material 520B, like nickel. FIG. 1c shows the carrier and wire of Wudu after it is laminated to the top transparent conductive layer 510b of solar cell 510. The deformation of the polymer sheet creates a force that holds the wire in electrical contact to the top conductive layer of the solar cell 510. When this structure is laminated to a glass top sheet (not shown), an additional layer of adhesive (for example, EVA) is required. The adhesive must be thick enough to fill around the wire geometry.

While the above-described construction of Wudu represents an improvement to the art, especially in eliminating inks and the problem of conductive material getting into defects, it nevertheless has three features that remain undesirable. For instance, round wire 520 of Wudu makes contact with the cell only along the small area represented by the tangent line 1 in shown in FIG. 1c. This creates practical difficulties in being able to consistently keep the contact resistance low in a manufacturing environment. Another problem is that the thickness of thermal adhesive 550b must be controlled rather precisely. If too thin, it might not completely fill the space around the wire; if too thick, it might underflow the round wire with sufficient pressure to lift the wire and break its electrical contact to the cell. Still another problem with Wudu is that the two-layer carrier represents extra material that leads of increased manufacturing costs.

There is thus a need for improved interconnect systems and methods.

SUMMARY OF THE INVENTION

In an aspect of the invention, an improved method for interconnecting thin film solar cells is provided, the method comprising using a flat mesh formed from a metallic strip to form a current collection grid over a solar cell (also "photovoltaic cell" herein).

In another aspect of the invention, a current collection grid for a thin film solar cell is provided, the current collection grid including a flat metallic mesh that provides high current collection efficiency with minimal shading loss. In embodiments, the current collection grid comprises a thin flat metallic mesh for contacting a conductive surface of a solar cell, the thin flat metallic mesh comprising wire-like elements, the wire-like elements joined in a circular, triangular, square, rectangular, trapezoidal, pentagonal, or hexagonal configuration. The current collection grid further comprises a tab region adjacent the thin flat metallic mesh, the tab region for forming an electrical connection to an adjacent solar cell.

In yet another aspect of the invention, a method for interconnecting solar cells is provided that lowers the contact resistance to the cell and reduces the magnitude of underflow forces during lamination.

In still another aspect of the invention, methods for interconnecting solar cells are provided that can be more economical than printed grid lines made from silver conductive inks. In an embodiment, a method for interconnecting thin film solar cells comprises attaching a thin flat metallic mesh to a first thin film solar cell to form a current collection grid on the first thin film solar cell. Next, the first thin film solar cell with the attached thin flat metallic mesh is connected to a second thin film solar cell having a flat metallic mesh to form a serial electrical connection between the first and said second thin film solar cells. Successive thin film solar cells are connected to the first and second thin film solar cells with the attached flat metallic meshes to form an electrically integrated string of interconnected thin film solar cells. Next, the string of interconnected thin film solar cells is integrated into a solar cell module.

In still another aspect of the invention, methods or forming solar cell modules are provided, the methods comprising bringing a thin flat metallic mesh from a first roll in contact with a thin film solar cell from a second roll, wherein the thin flat metallic mesh includes wire-like elements joined in a circular, triangular, square, rectangular, trapezoidal, pentagonal, or hexagonal configuration.

These and other objects, features and advantages of the present invention will become apparent to those skilled in the art after having read the following detailed description of the preferred embodiments, which are illustrated in the several figures of the drawing.

INCORPORATION BY REFERENCE

All publications, patents, and patent applications mentioned in this specification are herein incorporated by reference to the same extent as if each individual publication, patent, or patent reference was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings, which are not necessarily drawn to scale, and of which:

DETAILED DESCRIPTION OF THE INVENTION

While preferable embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein can be employed in practicing the invention.

Mesh Interconnects and Solar Cell Modules

In an aspect of the invention, current collection grids for use with solar cells (also "photovoltaic cells" herein) are provided. Current collection grids (also "mesh interconnects" herein) are configured to form contacts to solar cells. Mesh interconnects of embodiments of the invention can minimize top-contact interference (shading losses) with incoming light while improving the electrical contact to a top conductive layer of a solar cell.

In embodiments, a grid for collecting current from a solar cell is provided. The current collection grid comprises a thin flat metallic mesh for contacting a conductive surface of a solar cell (also "photovoltaic cell" herein). The thin flat metallic mesh comprises wire-like elements, the wire-like elements joined in a circular, triangular, square, rectangular, trapezoidal, pentagonal, or hexagonal configuration. The wire-like elements can have circular (or substantially circular) cross-sections. The current collection grid further comprises a tab region adjacent the thin flat metallic mesh. The tab region is configured to form an electrical connection to an adjacent solar cell. In an embodiment, the width of each the wire-like elements is between about 0.001 inches and 0.01 inches, or between about 0.002 and 0.006 inches. In an embodiment, the thin flat metallic mesh is formed of copper. In an embodiment, the thin flat metallic mesh is formed of nickel plated copper Reference will now be made to the figures, wherein like numerals refer to like parts throughout. It will be appreciated that the figures and structures therein are not necessarily drawn to scale.

Figure 2:
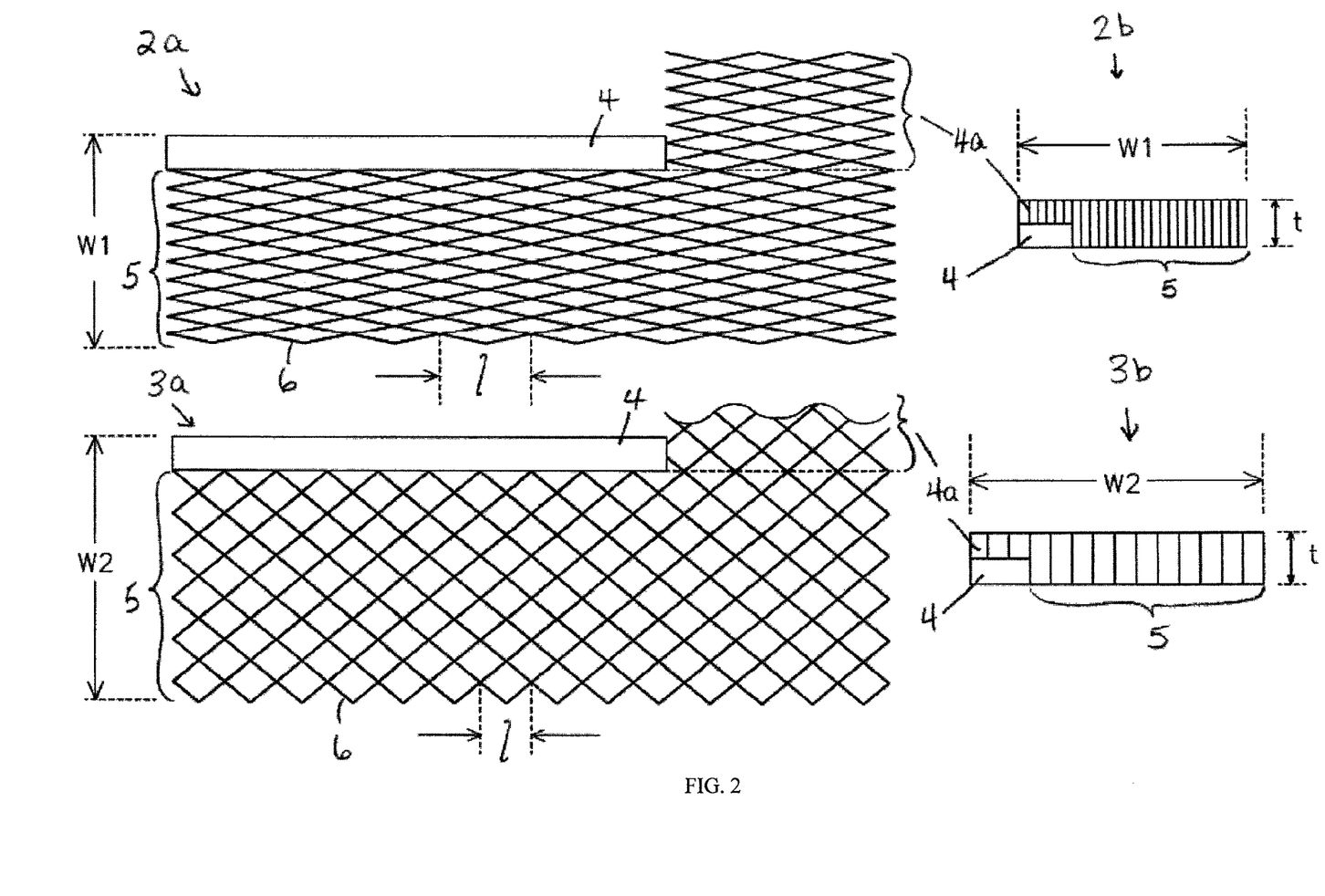
FIG. 2 shows planar and cross sectional views of two examples of a flat metallic mesh, in accordance with an embodiment of the invention.

FIG. 2 shows planar top views (left) and cross sectional side views (right) of current collecting (or collection) grids formed from flat metallic meshes. While these meshes are illustrated with size proportions that are consistent with flexible thin film solar cells, it will be appreciated that they can be scaled for rigid wafer cells with a more square-like (e.g., square) proportion. Both grids 2a and 3a include a solid region 4 (also "tab" and "tab region" herein) used to make the interconnection to the next cell, and a mesh region 5 which forms the current collecting grid for a cell of similar size. The mesh region includes connected wire-like elements 6 of small dimension with square or rectangular cross sectional shape. In an embodiment, most of the mesh is open space. Area 4a indicates that alternatively an area of mesh can be used to make the interconnection (to an adjacent cell) instead of a solid tab. The same regions in cross sectional views 2b and 3b are identified. In these examples, the mesh is not considered to be coated with other materials; however, optional coatings will be discussed later. Planar views 2a and 2b are approximately to scale with widths 'W1' and 'W2' being typically a few inches, such as, for example, 2 and 3 inches, respectively. At this scale the width of tab 4 can be about half an inch, while mesh area 4a can be any width up to that of 5, i.e., the cell width. However, for clarity purposes, cross sectional views 2b and 3b have been illustrated with greatly-exaggerated thicknesses 't' in comparison to the widths 'W1' and 'W2'. Thicknesses 't' as well as mesh elements 6 can be of the order of a few thousands of an inch ("mils"). In an embodiment, thicknesses 't' can be between 3 and 5 mils. Because the tab region 4 provides a visual break between the area of mesh that covers the solar cell and the part that is used for interconnection, it is shown in that fashion throughout this discussion. However, as discussed above, it is actually not necessary to have a solid tab region in all applications.

In various embodiments, the widths 'W1' and 'W2' of the mesh depend on the current carrying capacity of the mesh across the width of the cell. This grid design does not use specific buss bars as the more traditional silicon solar cells use. Instead the cross section of the mesh and the density of the lines determine the resistance the generated current encounters in flowing across the cell width. In this design, the traditional buss bars can be considered to be averaged into the grid lines. For these reasons the width of the cells are somewhat restricted in size for a given foil thickness. For foils of a few mils thickness, a cell width of the order of a few inches would be appropriate for a good conductor, such as copper. Shading losses of about 4% or less can be maintained. Going wider for the same thickness of foil requires that the width of the mesh lines increase, but the shading losses would then also increase. The shading loss could grow quite large for very wide cells. However, the thickness of the foil can be increased for the same mesh element width, allowing wider cells without sacrificing shading loss. The length of the mesh can be relatively long, but cannot exceed the length or width of the module they must fit into. Cells with widths up to about 6 inches and lengths from about 6 inches long to over 18 inches long lie in a reasonable range for obtaining desirable values of voltage for modules of ordinary size. Clearly the mesh could be used for interconnections of thin film solar cells on either rigid (i.e. wafers) or flexible substrates, but it is especially useful for flexible substrates in roll-to-roll processing. Because the mesh can be made or cut to a variety of lengths, it is convenient to form the mesh from a roll of metallic tape and re-roll the mesh for later use.

There are several features of note in the Figure. First mesh 5 has open patterns that may range from narrow diamonds 2a to nearly perfect squares 3a. The characteristic lengths 'l' of the openings are similar to the spacing of conventional grid lines, for example on the order of 3 to 6 millimeters. The net resistance for the mesh is lower than for conventional grids of similar geometry because of the interconnection of its elements. From any point in the mesh there are multiple paths to the tab whereas for conventional grids there is only a single line. The total resistance for a mesh of a given length is proportional to the sum of the cross sectional areas of the connections of the elements to the tab, which can be changed by changing the scale of the mesh. Therefore, a solid tab merely provides a more robust area with which to make the interconnection than the mesh alone, but it does not provide any reduced resistance in the plane of the mesh. Additionally, the elements of the mesh are not made from "woven" wires, but are coplanar. Views 2b and 3b indicate that the mesh is flat with essentially the same thickness as the tabs. Interconnection with mesh also can provide some strain relief similar to the "Z" tab connection used in silicon cells. One way such a mesh can be made will now be discussed. In this figure and those that follow like elements are labeled consistently throughout.

Figure 3:
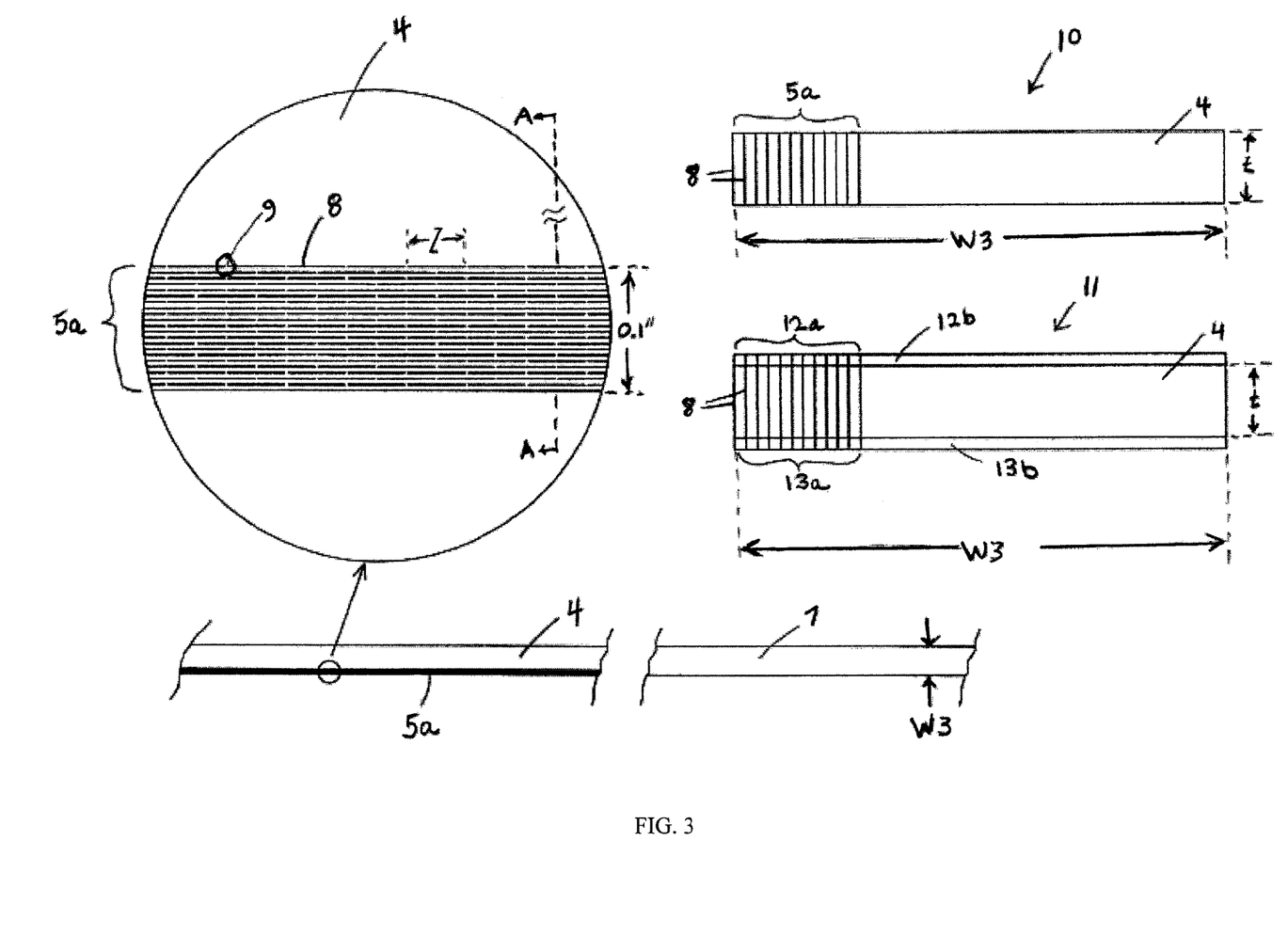
FIG. 3 is a schematic view of a metallic strip or tape illustrating the fabrication of a flat metallic mesh, in accordance with an embodiment of the invention.

The mesh used in this invention can be constructed from a strip of metallic foil 7 of width 'W3' as shown in FIG. 3. In certain embodiments, the metallic foil is formed of one or more of copper, nickel, gold, silver, platinum, palladium, aluminum, beryllium, rhodium, molybdenum and tungsten. In an embodiment, the metallic foil is formed of copper. For example, the metallic foil can be a copper foil. For example, the metallic foil can be a copper foil. As another example, the metallic foil can be a nickel coated copper foil. The general dimensions are compatible with those as described above for the elements of FIG. 2. The strip may have a length appropriate for the size of the solar cell upon which it is to be applied, or it could be tape-like in roll form. For example, strip 7 to be a copper foil or a nickel plated copper foil with a width of about 0.6 inches and a thickness of about 5 mils (the nickel plating is not shown).

With continued reference to FIG. 3, the first step in forming mesh 5 of FIG. 2 is to punch a series of linear slits, region 5a, along one edge of strip 7 leaving tab region 4 solid. As was mentioned before, tab 4 could also be mesh, in which case the initial width of strip 7 could be much less, thus conserving material. The enlarged view in FIG. 3 shows that linear punches 8 in region 5a have approximately the same characteristic length 'l' as previously described for the mesh in FIG. 2. Very small gaps 9 (on the order of 5 to 10 mils) are left between slits 8, which later become the points of connection for the mesh elements. Note that each row of slits 8 is offset linearly from adjoining rows by one-half of the distance 'l'. In this example there are 20 rows of slits placed 5 mils apart, giving a total width (as indicated) of 0.1 inches for slit region 5b, and leaving a width of 0.5 inches for tab 4.

With continued reference to FIG. 3, view 10 is a cross section through A-A of the slit strip, where thickness T is exaggerated for clarity as described before in FIG. 2. The thickness 't' can be between about 0.001 inches and 0.01 inches, such as, e.g., 0.005 inches. W3 can be between about 0.1 inches and 1 inch, such as, e.g., 0.600 inches. Only every other slit 8 is indicated since the cross section passes through gaps 9 between the slits. In actuality, the cross section of a web element is square (e.g., 5 mils by 5 mils), but it is highly distorted in FIG. 3. Indeed thickness 't' can be increased while the slit spacing remains the same, creating a taller rectangular element that would have lower resistance with hardly any increase in shading loss. Thus the resistance can be tuned as needed with little adverse effect on shading loss.

Continuing the discussion with regard to FIG. 3, view 11 indicates that strip 7 may have a number of optional coatings applied before the slitting operation, even if nickel plating has already been applied to the strip. For example, a coating 12a covering the sunward side of region 5a can be a simple dark cosmetic coating to make the mesh less visible in a finished module, while coating 12b on the tab region can be a solder or a B-staged conductive epoxy or other coating useful to form a conductive bond for interconnecting cells. For example, layer 12b could be the low melting point eutectic alloy of indium and tin, which melts at about 118° C. During lamination into a module, the temperature exceeds 118° C. causing the solder to melt and bond the mesh to the transparent top electrode of the cell forming a very good ohmic contact. Such a solder layer should be very thin or coated only intermittently on the mesh in order to reduce the chances of shunting in defects. A B-staged epoxy would be stiffer and less prone to filling defects that might cause shunts. On the cell side, coating 13a can be similar to that of 12b for forming a connection to the transparent conducting top coating of the solar cell below, while coating 13b can be a coating with additional corrosion protection properties. In an alternative embodiment, coating 13b can be omitted. After slitting (with or without optional coatings), the mesh is formed by expanding slit region 5a into mesh 5 of FIG. 2. This operation can be done as each line or line pair is punched, or expanding dies can be used. The most careful slitting operation can leave the mesh elements slightly rotated out of the plane of the initial strip. Rerolling the mesh after the expansion can insure a good quality of flatness. If the beginning strip were raw copper without nickel plating, then the entire expanded mesh and tab can be nickel plated before use. An advantage of post expansion nickel plating is that all sides of the mesh will be plated. In addition it will be appreciated that the coatings described herein that are applied to the strip before slitting can also be applied to the mesh after it is formed. However, application to the strip before slitting can be more convenient and economical from a manufacturing perspective.

Figure 4:
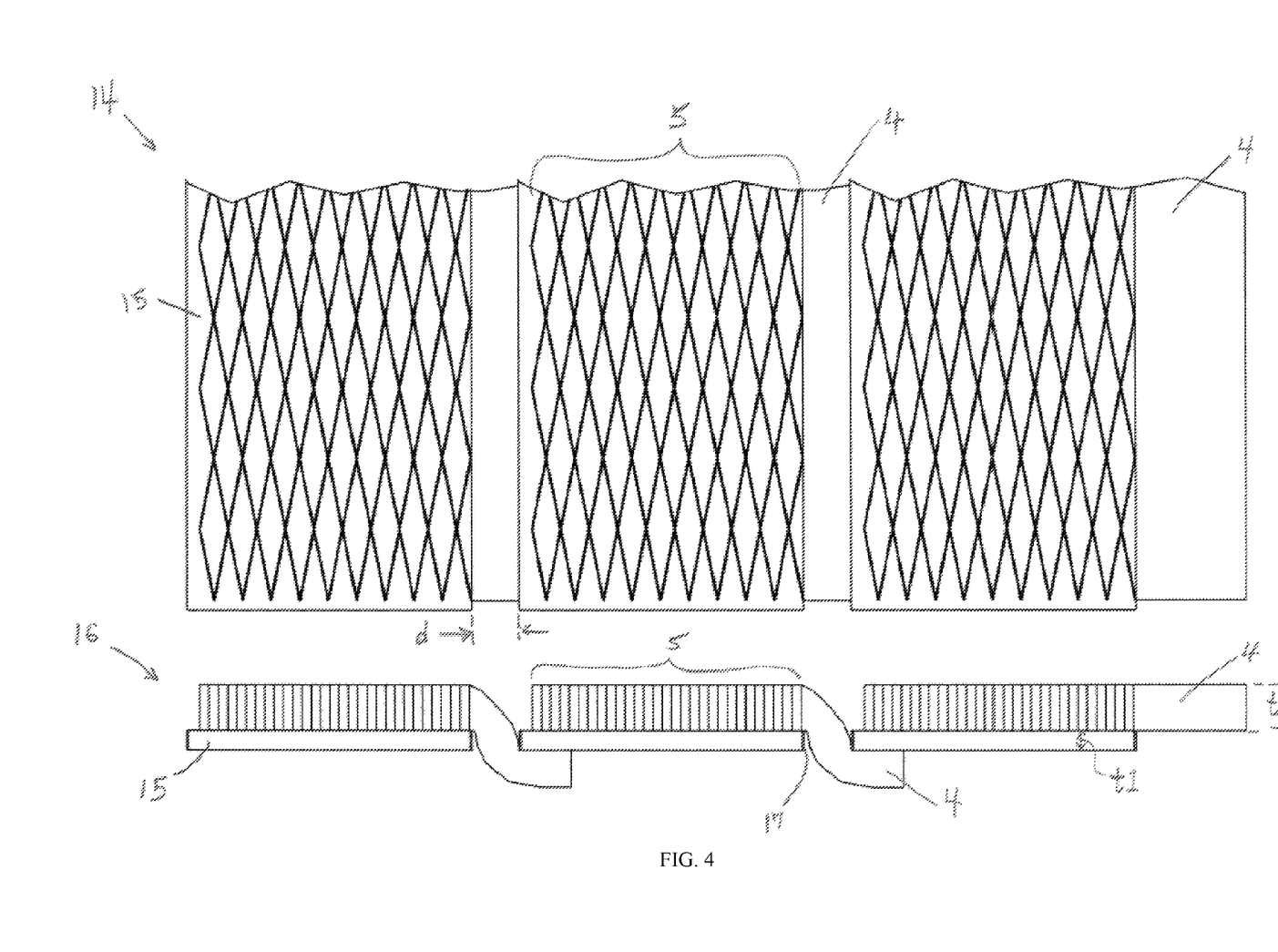
FIG. 4 is a schematic diagram showing a planar view of a section of a string of interconnected cells, and a corresponding cross sectional view illustrating details of the interconnection, in accordance with an embodiment of the invention.

FIG. 4 illustrates a planar view 14 of a section of interconnected flexible thin film solar cells 15 of arbitrary length using the flat metallic mesh of embodiments of the invention. Included is a corresponding cross sectional schematic view 16 showing the basic details of the electrical connection. For clarity, all of the possible optional coatings on the mesh have been omitted. It will be appreciated that the views are not drawn to scale. The thickness of solar cells 15 includes the flexible metal foil substrate, since the active films are extremely thin at this scale. Distance 'd' between cells 15 is exaggerated with respect to the widths of the cells and mesh, and the solar cell and mesh thicknesses in view 16 are exaggerated with respect to their respective widths. Tab 4 appears wider than usual with respect to the mesh width because of the extra exaggerated distance 'd'. However, the thicknesses of the cells 't1' and the mesh 't', as illustrated, might be sufficient for certain applications. In an embodiment, 't1' is about 2 mils and T is about 5 mils. Cells 15 are shown with a dielectric edge coating 17 that protects them from being electrically shorted when tab 4 (either solid or mesh) is bent down and under to bond to the backside of the adjoining cell. Since the cells in this illustration are considered to be deposited on a metal foil substrate (for example stainless steel), the substrate can function as the back electrode of the cell. Because the back contact area is relatively large, a low total resistance can be achieved with a number of materials whose specific resistance is not extremely low. Metal filled epoxies are examples of some of these types of materials. If the substrate were a thin dielectric (like a polyimide foil) or a glass wafer, then tab 4 would have to be much narrower and attached on the top of the adjoining cell on an area of exposed back electrode.

Figure 5:
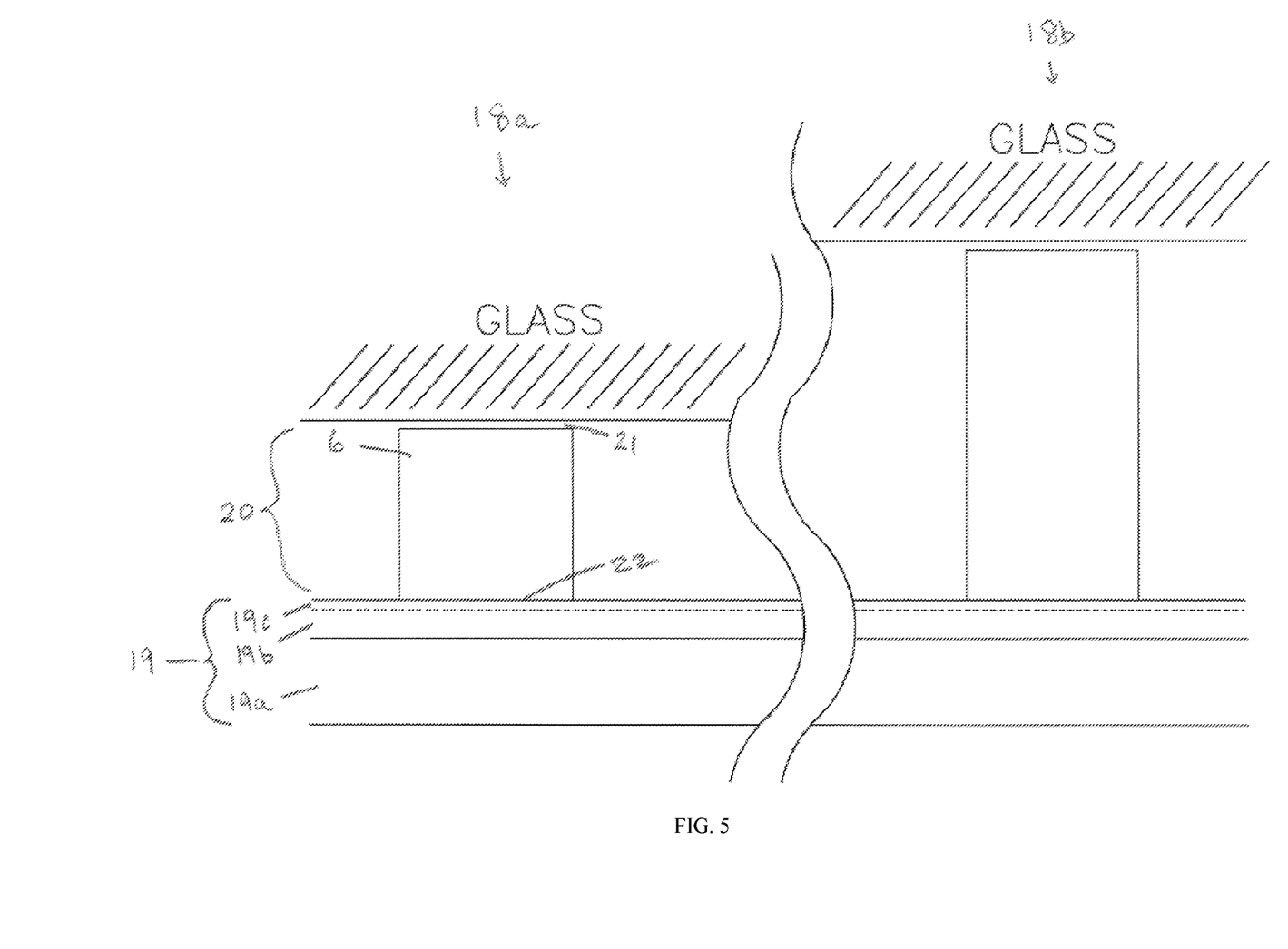
FIG. 5 is a cross sectional diagram showing a first embodiment for square and rectangular elements of a flat metallic mesh laminated to a flexible thin film solar cell, in accordance with an embodiment of the invention.

FIG. 5 is a cross sectional schematic diagram illustrating a simple application of an uncoated metallic mesh element, 6 in FIG. 2, to a flexible thin film solar cell 19 when it is laminated to the sunward facing glass during module construction. View 18a shows a square element 6, and view 18b illustrates an element that is taller than that shown in view 18a, but having the same width. As discussed earlier, the metallic strip 7 of FIG. 3 can be made thicker for a given slitting width to decrease the mesh resistance with only slight increases in shading loss. View 18b illustrates this embodiment, and except for height, all the features described for 18a likewise apply to 18b. Continuing the discussion with respect to view 18a, flexible thin film solar cell 19 includes a flexible substrate 19a (metallic foil), the active part of the cell 19b, and the transparent conducting oxide (TCO) layer 19c to which the mesh element must make good electrical contact. The diagram is not to scale. The glass can be about 25 times thicker than mesh element 6 while cell elements 19b and 19c can be thinner than the mesh. For the example discussed above, element 6 can be about 5 mils square and cell substrate 19a can be about 2 mils thick.

With continued reference to FIG. 5, in view 18a, a metallic mesh can be made as previously described and laminated between a flexible solar cell 19 and a sheet of glass using a transparent thermoset or thermoplast material 20, like industry standard ethylene vinyl acetate (EVA), or a material of similar functionality. In an embodiment, if EVA is supplied and used in sheet form, a minimum thickness can be selected to insure proper filling around mesh element 6 without leaving voids while at the same time allowing the glass to exert pressure on the mesh. Therefore, spacing 21 between the glass and mesh can be kept very small, consistent with forming a good bond. If the height of the mesh is increased, as in 18*b*, then a thicker sheet of EVA would be required to achieve proper lamination. It is evident that the mesh geometry provides a much larger area of electrical contact 22 between element 6 and TCO layer 19*c* than that of prior art FIG. 1*c* for the approximately the same shading loss.

Figure 6:
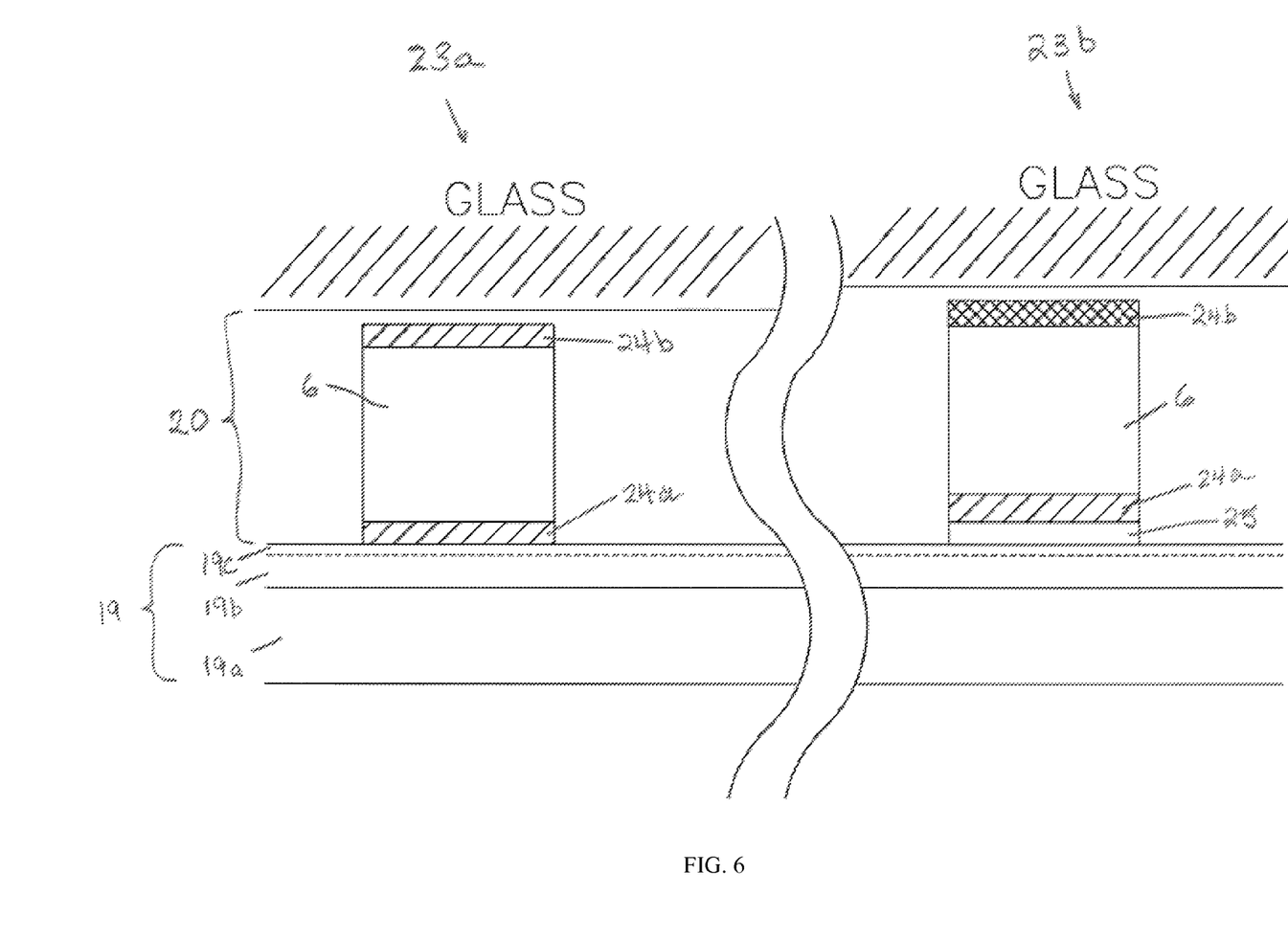
FIG. 6 is a cross sectional diagram showing two alternative embodiments for elements of a flat metallic mesh where coatings are applied to the metallic strip before punching and expansion of the mesh, in accordance with an embodiment of the invention.

FIG. 6 shows views illustrating the use of the mesh element 6. Views 23*a* and 23*b* show two embodiments that might be preferable in certain circumstances. Since those skilled in the art would be able to develop many other possible combinations of coatings, the embodiments shown here should not to be interpreted as limiting the scope of the invention. Example 23*a* shows a mesh element 6 with coatings 24*a* and 24*b* applied to each side of the metallic strip before the mesh is formed. In an embodiment, mesh element 6 can be formed of copper, which provides high electrical conductivity combined with modest cost. In an embodiment, copper can be coated with a material that is resistant to oxidation and corrosion. Plated nickel or tin a few micrometers in thickness are generally good choices for many of these situations. For thin film solar cells in particular, coating 24*a* that is in contact with the TCO layer might be required to prevent the copper from reacting with and degrading the TCO. While gold or some of the other noble metals would provide the necessary functionality, nickel or tin can provide it more economically. Layer 24*b* could be the same as 24*a* or it could be different since there are typically no issues with corrosion at the glass interface. It might be more convenient to plate the mesh, such as with nickel or tin for example, after the mesh is formed. In such an embodiment mesh element 6 would be coated on all four sides with the same material. This extension of the embodiment is not explicitly indicated in the Figure.

With continued reference to FIG. 6, view 23*b*, mesh element 6 is illustrated with the same coating 24*a* as described above, but 24*b* is a cosmetic coating selected to closely match the color of the solar cell, so the mesh would not be visually obvious in a module. It might be as simple as a dark colored paint, or a more complex dark anodized layer of the material of element 6. In this embodiment, layer 25 represents an electrically conductive bonding layer that secures mesh element 6 with its optional coating 24*a* to TCO layer 19*c*. Layer 25 may include a conductive B-staged epoxy, a low temperature solder, or other conductive bonding layer as previously discussed. In an embodiment, if layer 25 includes the eutectic alloy of indium and tin with a melting point of about 118° C., then coating 24*a* can be omitted since layer 25 can also act as a corrosion-resistant barrier between the mesh element 6 and the TCO layer 19*c*.

Figure 7:
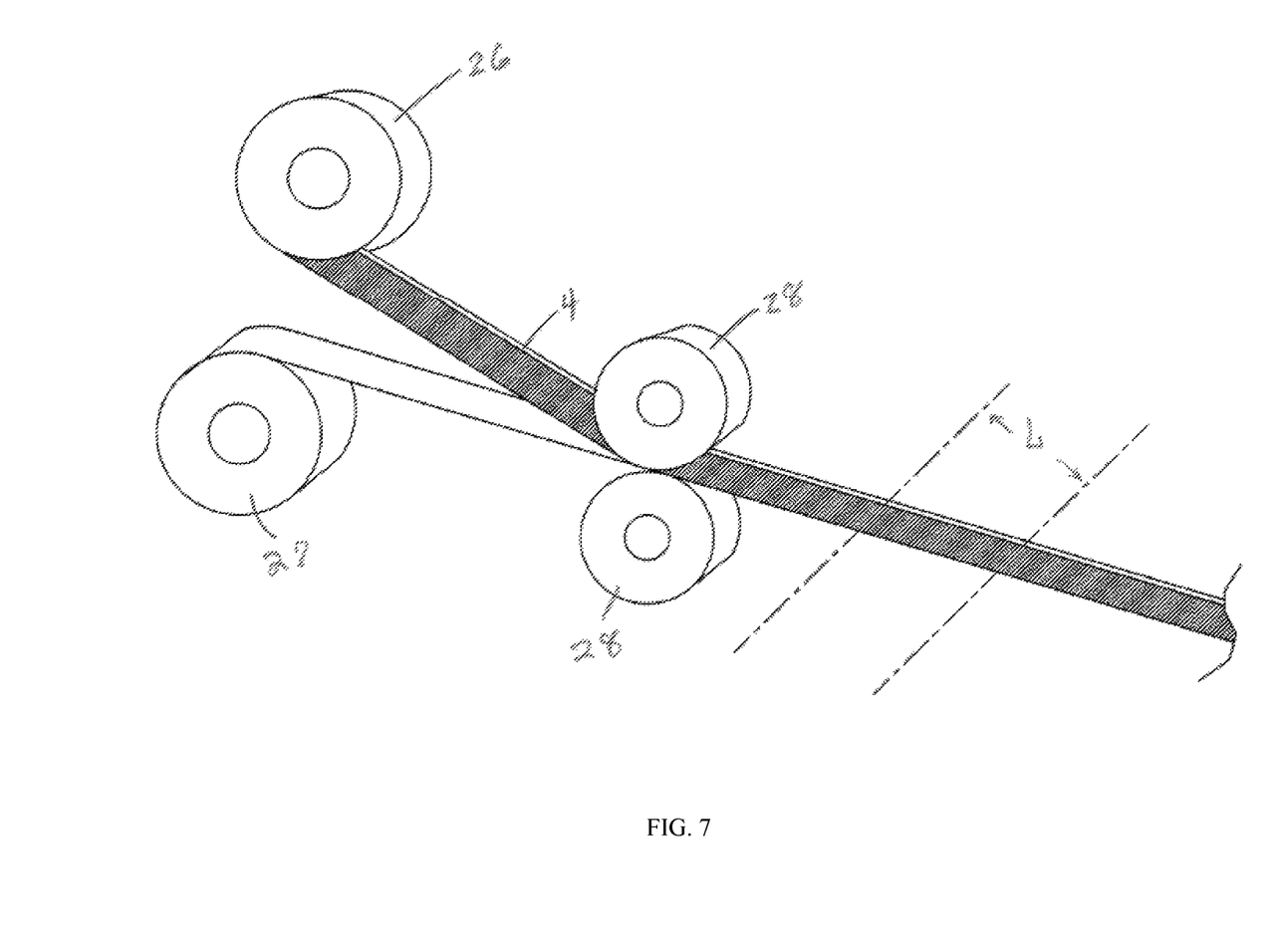
FIG. 7 shows the application of the mesh to flexible solar cell material where both are dispensed from rolls of material and continuously laminated together, in accordance with an embodiment of the invention.

While the present invention can be practiced by forming the mesh section-by-section for sequential single solar cell applications, at least some degree of automation can be incorporated in the process. FIG. 7 schematically illustrates how a roll of mesh 26 and a roll of solar cell material 27 can be continuously joined by, for example, a set of rollers 28 to form a continuous strip of solar cell material with a laminated mesh grid. Rollers 28 can be heated to bond a low temperature solder, or to set a B-stage conductive epoxy material applied to the mesh, as previously described. The roll of mesh and the roll of cells could each have a protective interleaved layer of material (not shown) which would have to be stripped off just before the lamination step. In an embodiment, as shown in FIG. 4, tab 4 must overhang the cell material and only mesh region 5 covers the cells. The strip of material can then be cut into individual solar cells of predetermined (or desired) length which subsequently (not shown) can be tested and sorted based on electrical performance before being laminated into modules.

Figure 8:
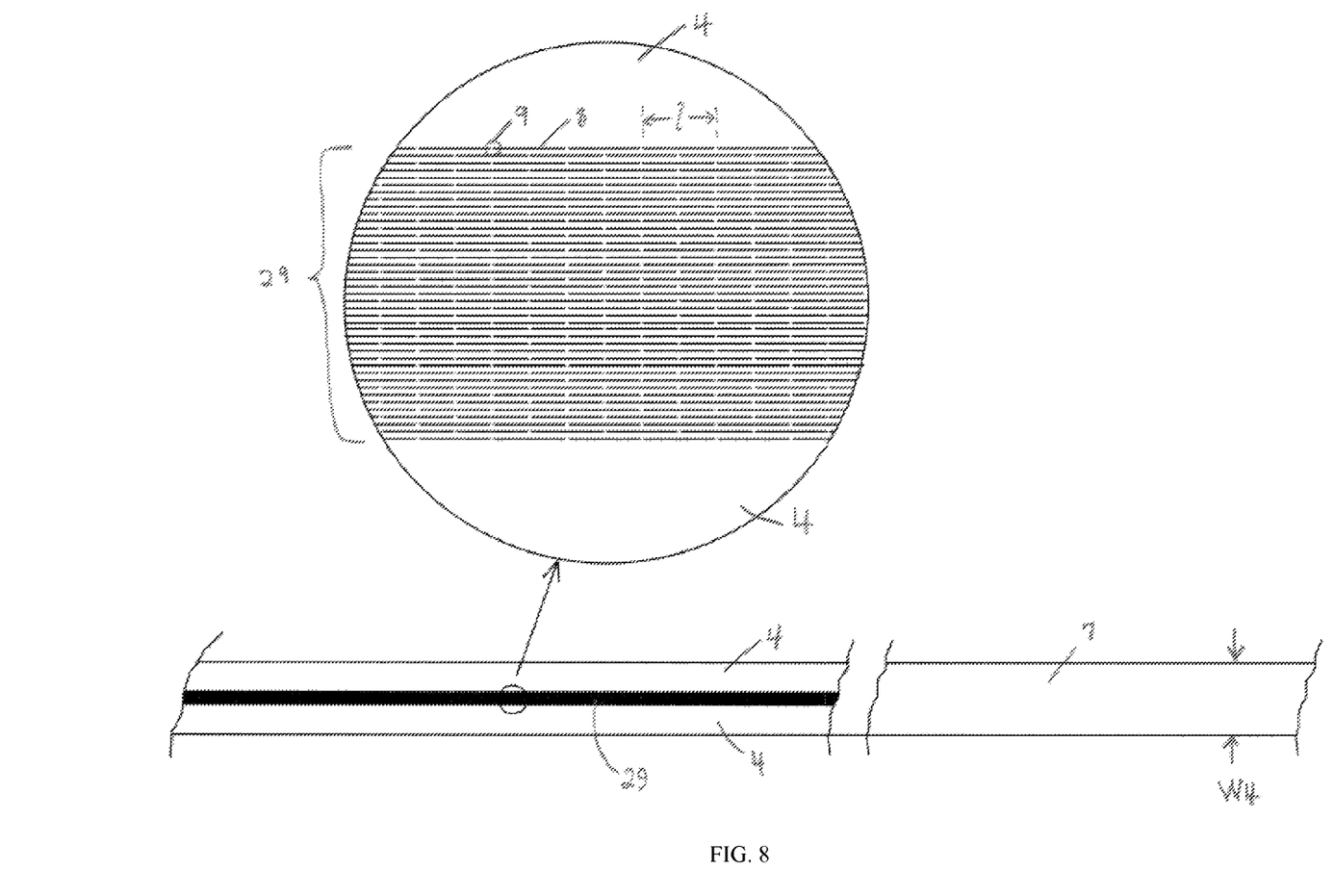
FIG. 8 is a schematic diagram depicting an alternative method of producing a dual wide mesh member from a double wide metallic strip, in accordance with an embodiment of the invention.

With reference to FIG. 8, an alternative way of forming the mesh from a metallic strip is shown, in accordance with an embodiment of the invention. In comparison to FIG. 3, the width 'W4' of metallic strip 7 is twice that of 'W3' and the width of slit area 29 is twice that of 5*a*. This creates a tab 4 on each side of mesh area 29 that can be the same size as the corresponding tab in FIG. 3. Detailed parameters, such as slit length, spacing, and gap in FIG. 8, can be identical to those of FIG. 3. Expansion of the slit area to form the mesh also follows the procedure previously described. The advantage of this "double mesh" is that a solid tab 4 now exists on each side of the mesh, which can make the process of creating a roll of mesh material much easier to accomplish and subsequently more convenient to handle in a lamination process, as described in FIG. 7. In such a case, the roll of cell material 27 shown in FIG. 7 would likewise have to be doubled in width.

Figure 9:
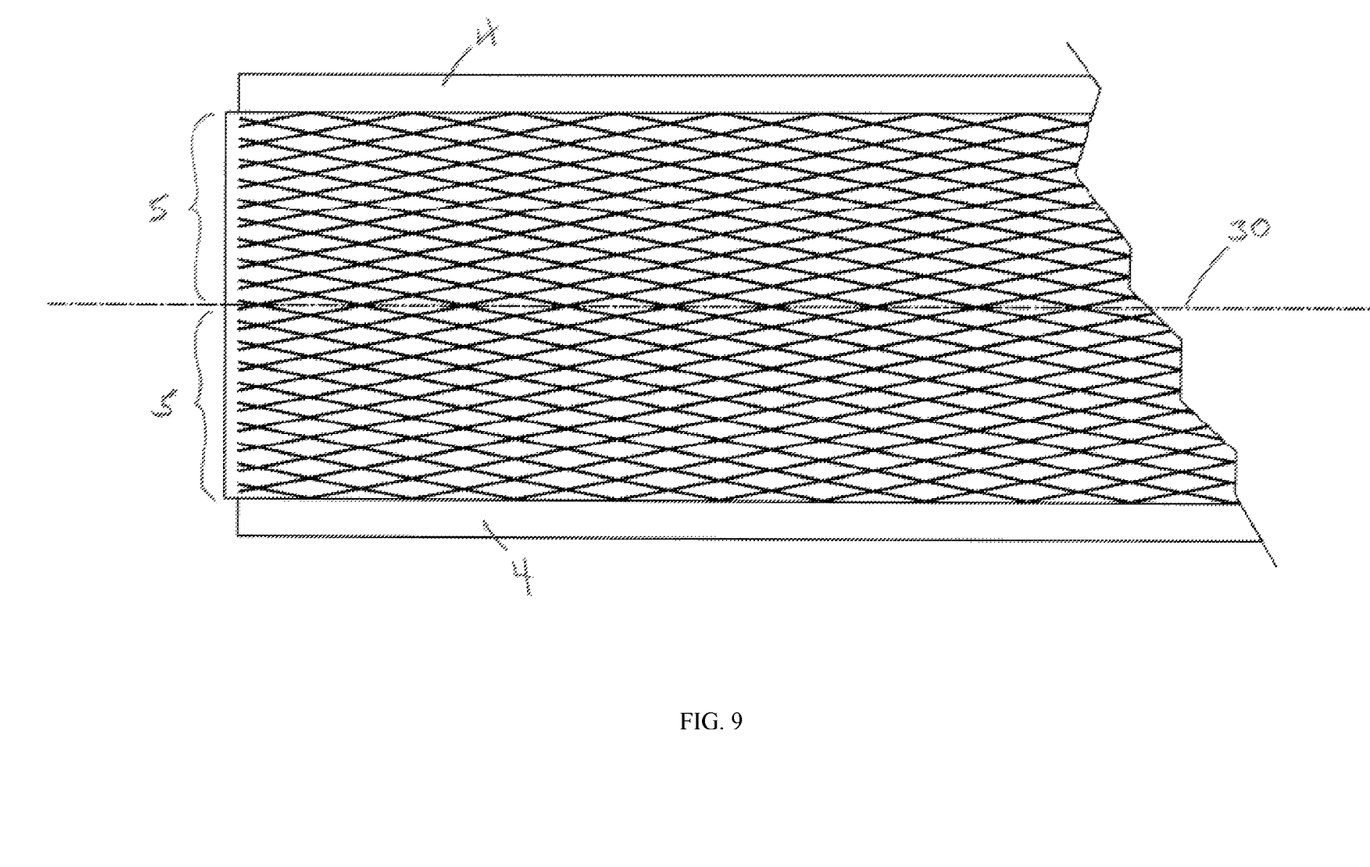
FIG. 9 shows the metallic strip of FIG. 8 after it is expanded into a double-wide mesh that is applied to a double width of solar cell material and then cut into two separate cells, in accordance with an embodiment of the invention.

FIG. 9 shows a double width of grid mesh laminated to a double width of flexible solar cell material. For either individual cells or cells cut from a continuous roll, the double wide material must be cut along central dashed line 30 to create two cells each with the dimensions of those previously described.

Methods for Forming Solar Cell Modules

In an aspect of the invention, methods for interconnecting thin film solar cell modules are provided. The methods comprise forming a thin flat metallic mesh with an interconnecting region from a thin metallic strip, the thin flat metallic mesh including wire-like elements. In an embodiment, each of the wire-like elements has a rectangular cross-sectional shape. Next, the thin flat metallic mesh is attached to a first thin film solar cell to form a current collection grid on the first thin film solar cell. Next, the first thin film solar (with the attached flat metallic mesh) is connected to a second thin film solar cell having a flat metallic mesh, thereby forming a serial electrical connection between the first and said second thin film solar cells. In an embodiment, successive thin film solar cells are continually connected to the first and second thin film solar cells with the attached flat metallic mesh to form an electrically integrated string of interconnected thin film solar cells. Next, one or more of the strings of the integrated thin film solar cells are integrated into solar cell modules.

In an embodiment, the thickness of the thin metallic strip is between about 0.002 and 0.010 inches. In an embodiment, the thin flat metallic strip comprises elemental copper or a copper alloy. In an embodiment, copper can be alloyed with one or more of silver, gold, chromium, zirconium, zinc, tin. In an embodiment, the thin flat metallic strip can include one or more coatings, such as a nickel coating or a tin coating.

In an embodiment, the thin flat metallic mesh can include an interconnecting region. In an embodiment, the thin flat metallic mesh can include wire-like elements. In an embodiment, the wire-like elements are joined in a manner providing spaces between the wire-like elements, such as spaces having circular, triangular, square, rectangular, trapezoidal, pentagonal, hexagonal, or other geometric cross-sectional shapes. For example, the wire-like elements can have a rectangular cross-sectional shape. In an embodiment, the width of each of the wire-like elements is between about 0.001 inches and 0.01 inches, or between about 0.002 inches and 0.006 inches.

In an embodiment, the thin flat metallic mesh can be attached to the first thin film solar cell with a conductive epoxy, such as, e.g., a B-staged conductive epoxy. In another embodiment, the thin flat metallic mesh can be attached to the first thin film solar cell with a low melting point solder.

In an embodiment, the combined width of the thin flat metallic mesh and the first thin film solar cell is between about 1.5 and 6.0 inches.

In embodiments, the thin metallic mesh at least partially covers the solar cell. In an embodiment, the thin metallic mesh covers a substantial portion of the solar cell. In an embodiment, the thin metallic mesh covers the solar cell at least up to about 1 millimeter of the edge of the solar cell on three sides. In an embodiment, on the side of the solar cell that connects to an adjacent solar cell, the thin metallic mesh overhangs the solar cell by the width of the tab area, which can either be a solid region or more mesh region.

Since the thin metallic mesh has to carry the entire cell current across one solar cell to the next solar cell, the resistance needs to stay sufficiently low so as to minimize $I^2R$ losses. In certain embodiments, the dimensions of the thin metallic mesh are selected so as to minimize $I^2R$ losses and shading losses. In an embodiment, the wider the solar cell, the more the mesh cross-sectional area has to increase to adequately carry the increasing current that is generated. The larger cross-section of mesh increases the shading loss of the module. In an embodiment, at a cell width of about 6 inches, sufficient conductivity with a shading loss of about 5% can be achieved.

In an embodiment, the thin flat metallic mesh is plated with nickel (Ni). For example, the thin flat metallic mesh can be formed of copper and plated with Ni. This can provide for a metallic mesh with ideal electrical conductivity, while minimizing, if not eliminating, corrosion upon exposure of the metallic mesh to the ambient environment.

In an embodiment, the first thin film solar cell is formed on a thin flexible substrate, such as a foil substrate. In an embodiment, the flexible foil substrate comprises stainless steel. In embodiments, the first thin film solar cell can be formed by thin film deposition, such as, e.g., atomic layer deposition (ALD), chemical vapor deposition (CVD), or molecular beam epitaxy (MBE).

In other embodiments, methods for forming a solar cell modules comprise bringing a thin flat metallic mesh from a first roll in contact with a thin film solar cell from a second roll (see FIG. 7), wherein the thin flat metallic mesh includes wire-like elements joined in a circular, triangular, square, rectangular, trapezoidal, pentagonal, hexagonal, or other geometric configuration. In an embodiment, the thin flat metallic mesh from the first roll and the thin film solar cell from the second roll are continuously brought in contact with one another. In an embodiment, the thin flat metallic mesh from the first roll is brought in contact with the thin film solar cell from the second roll with the aid of a set of rollers downstream from the first roll and second roll (see, e.g., rollers 28 of FIG. 7).

In an embodiment, the thin flat metallic mesh covers a substantial portion of the thin film solar cell. In embodiments, the thin film solar cell having the thin flat metallic mesh is divided into individual thin film solar cells. The individual thin film solar cells can then be connected (e.g., in series) to form a solar cell module. In embodiments, the thin flat metallic mesh is attached to the thin film solar cell with the aid of a conductive epoxy or a low melting point solder. For example, the thin flat metallic mesh can be attached to the thin film solar cell when they are brought in contact to one another. This can be accomplished, for example, by providing a conductive epoxy or low melting point solder before the thin flat metallic mesh is brought in contact with the thin film solar cell.

In an embodiment, the thin flat metallic mesh substantially covers a top surface of the thin film solar cell. In an embodiment, with the thin flat metallic mesh substantially covering a top surface of the thin film solar cell, the wire-like elements of the mesh are arranged and configured to minimize shading losses associated with the thin film solar cell (when in use) while maximizing contact to a top conductive surface of the thin film solar cell. In this respect, the size of the wire-like elements (e.g., wire diameters) and the manner in which the wire-like elements are joined (e.g., joined to yield square, rectangular, or trapezoidal spaces) can be selected to minimize shading losses while maximizing the contact to the top surface of the thin film solar cell.

While preferable embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein can be employed in practicing the invention. It is intended that the following claims define the scope of the invention and that methods and structures within the scope of these claims and their equivalents be covered thereby.

What is claimed is:

1. A method for interconnecting thin film solar cells, comprising:
   (a) attaching a first surface of a thin flat metallic mesh to a first thin film solar cell material to form a current collection grid on the first thin film solar cell material, wherein a metal foil comprises a slit region forming the thin flat metallic mesh and a tab region that is contiguously formed with the slit region, wherein the first thin film solar cell material and the metal foil are provided in rolls;
   (b) unrolling the roll of first thin film solar cell material and the roll of metal foil;
   (c) heating a pair of rollers, wherein one of the rollers is dispersed adjacent to the unrolled first surface of the thin flat metallic mesh and the other roller is disposed adjacent to the unrolled first thin film solar cell material;
   (d) connecting a second surface of the tab region directly to a backside of a second thin film solar cell material having a flat metallic mesh to form a serial electrical connection between the first and the second thin film solar cell materials, wherein the first surface of the thin flat metallic mesh and the second surface of the tab region are on opposing sides of the metal foil, wherein the second thin film solar cell material is provided in a roll;
   (e) connecting successive thin film solar cell material to the first and second thin film solar cell material with the attached flat metallic meshes to form an electrically integrated roll of interconnected thin film solar cell material; and
   (f) cutting the electrically integrated roll of interconnected thin film solar cell material into an electrically integrated string of interconnected thin film solar cells;
   (g) integrating the string of interconnected thin film solar cells into a solar cell module.

2. The method of claim 1, further comprising forming the thin flat metallic mesh from the metal foil before attaching the thin flat metallic mesh to the first thin film solar cell material, wherein the metal foil comprises a thin flat metallic strip.

3. The method of claim 2, wherein a thickness of the thin metallic strip is between about 0.002 and 0.010 inches.

4. The method of claim 2, wherein the thin flat metallic strip comprises copper.

5. The method of claim 2, wherein the thin flat metallic strip includes one or more coatings.

6. The method of claim 5, wherein the one or more coatings include nickel.

7. The method of claim 5, wherein the one or more coatings include tin.

8. The method of claim 1, wherein the thin flat metallic mesh includes wire-like elements, the wire-like elements joined in a square, rectangular, or trapezoidal configuration.

9. The method of claim 8, wherein a width of each of the wire-like elements is between about 0.002 and 0.006 inches.

10. The method of claim 1, wherein the thin flat metallic mesh is attached to the first thin film solar cell material with a conductive epoxy.

11. The method of claim 1, wherein the thin flat metallic mesh is attached to the first thin film solar cell material with a low melting point solder.

12. The method of claim 1, wherein a combined width of the thin flat metallic mesh and the first thin film solar cell material is between about 1.5 and 6.0 inches.

13. The method of claim 1, wherein the thin flat metallic mesh is plated with nickel.

14. The method of claim 1, wherein the first thin film solar cell material is deposited on a thin flexible foil substrate.

15. The method of claim 14, wherein the thin flexible foil substrate comprises stainless steel.

16. A method for interconnecting thin film solar cells, comprising:
   (a) attaching a first surface of a thin flat metallic mesh to a first thin film solar cell material to form a current collection grid on the first thin film solar cell material, wherein the first thin film solar cell material comprises a dielectric at an edge portion of the first thin film solar cell material, wherein a metal foil comprises a slit region forming the thin flat metallic mesh and a tab region that is contiguously formed with the slit region, wherein the first thin film solar cell material and the metal foil are provided in rolls;
   (b) unrolling the roll of first thin film solar cell material and the roll of metal foil;
   (c) heating a pair of rollers, wherein one of the rollers is disposed adjacent to the unrolled first surface of the thin flat metallic mesh and the other roller is disposed adjacent to the unrolled first thin film solar cell material;
   (d) connecting the first thin film solar cell material via a second surface of the tab region of the attached metal foil directly to a backside of a second thin film solar cell material having a flat metallic mesh to form a serial electrical connection between the first and the second thin film solar cell materials, such that the metal foil is disposed adjacent to the dielectric, wherein the first surface of the thin flat metallic mesh and the second surface of the tab region are on opposing sides of the metal foil, wherein the second thin film solar cell material is provided in a roll;
   (e) connecting successive thin film solar cells to the first and second thin film solar cell materials with the attached flat metallic meshes to form an electrically integrated roll of interconnected thin film solar cell materials;
   (f) cutting the electrically integrated roll of interconnected thin film solar cell materials into an electrically integrated string of interconnected thin film solar cells; and
   (g) integrating the string of interconnected thin film solar cells into a solar cell module.

17. The method of claim 16, wherein the first thin film solar cell material is deposited on a thin flexible foil substrate.

18. The method of claim 17, wherein the thin flexible foil substrate comprises stainless steel.

19. The method of claim 16, further comprising forming the thin flat metallic mesh from the metal foil before attaching the thin flat metallic mesh to the first thin film solar cell material, wherein the metal foil comprises a thin flat metallic strip.

20. The method of claim 19, wherein a thickness of the thin metallic strip is between about 0.002 and 0.010 inches.

21. The method of claim 19, wherein the thin flat metallic strip comprises copper.

22. The method of claim 16, wherein the thin flat metallic mesh includes wirelike elements, the wire-like elements joined in a square, rectangular, or trapezoidal configuration.

23. The method of claim 22, wherein a width of each of the wire-like elements is between about 0.002 and 0.006 inches.

* * * * *